United States Patent
Mason et al.

(10) Patent No.: US 10,651,583 B1
(45) Date of Patent: May 12, 2020

(54) POWER SUPPLY FOR SOCKET ASSEMBLY

(71) Applicant: TE CONNECTIVITY CORPORATION, Berwyn, PA (US)

(72) Inventors: Jeffery Walter Mason, North Attleboro, MA (US); Michael David Herring, Apex, NC (US); Christopher William Blackburn, Bothell, WA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/224,139

(22) Filed: Dec. 18, 2018

(51) Int. Cl.
*H01R 13/187* (2006.01)
*H01R 13/02* (2006.01)
*H01R 13/627* (2006.01)
*H01R 12/71* (2011.01)
*H01R 13/14* (2006.01)
*H01R 13/502* (2006.01)

(52) U.S. Cl.
CPC ......... *H01R 13/187* (2013.01); *H01R 12/716* (2013.01); *H01R 13/025* (2013.01); *H01R 13/14* (2013.01); *H01R 13/502* (2013.01); *H01R 13/627* (2013.01)

(58) Field of Classification Search
CPC .. H05K 7/1069; H05K 7/1023; H05K 7/1061; H01R 13/187; H01R 13/025; H01R 13/627; H01R 13/14; H01R 13/502; H01R 12/716
USPC ................................................ 439/68, 71–73
See application file for complete search history.

(56) References Cited

U.S. PATENT DOCUMENTS

| | | | | |
|---|---|---|---|---|
| 4,433,886 A * | 2/1984 | Cassarly | ............... | H01L 23/552 257/E23.114 |
| 4,554,505 A * | 11/1985 | Zachry | ................. | G01R 1/0433 324/750.25 |
| 4,872,843 A * | 10/1989 | Anstey | ................... | H05K 7/023 439/69 |
| 5,176,524 A * | 1/1993 | Mizuno | .................. | H05K 1/141 439/329 |
| 5,383,787 A * | 1/1995 | Switky | .................... | H01L 23/32 439/67 |
| 5,611,697 A * | 3/1997 | Rall | ..................... | H01R 13/665 439/71 |
| 6,936,917 B2 * | 8/2005 | Lopata | .............. | H01L 23/49805 257/704 |
| 8,588,562 B2 * | 11/2013 | Zbinden | ............... | G02B 6/4232 385/14 |
| 8,690,589 B2 * | 4/2014 | Ngo | ................... | H01R 12/7052 439/630 |
| 8,821,169 B2 * | 9/2014 | Ng | ........................ | H01R 12/72 439/629 |

(Continued)

*Primary Examiner* — Gary F Paumen

(57) ABSTRACT

A socket assembly includes a socket connector including a socket substrate having an upper surface and a lower surface, upper socket contacts on the upper surface configured to be terminated to an electronic package and lower socket contacts configured to be terminated to a host circuit board. The socket connector includes first and second power contacts. The first power contact is configured to be terminated to the electronic package. The socket assembly includes a power connector terminated to the socket substrate having a power connector terminal electrically connected to the second power contact. The socket substrate is configured to electrically connect the power connector to the electronic package through the first power contact and the second power contact.

20 Claims, 5 Drawing Sheets

(56) References Cited

U.S. PATENT DOCUMENTS

| | | | |
|---|---|---|---|
| 8,840,415 B2 * | 9/2014 | Orris | H01R 12/592 439/329 |
| 2006/0139884 A1 * | 6/2006 | Noble | G06F 1/18 361/704 |
| 2009/0325415 A1 * | 12/2009 | Brist | H05K 7/1069 439/330 |

* cited by examiner

POWER SUPPLY FOR SOCKET ASSEMBLY

BACKGROUND OF THE INVENTION

The subject matter herein relates generally to socket assemblies for an electronic package of an electronic system.

Socket assemblies are used to electrically connect an electronic package, such as an integrated circuit or a computer processor, to a host circuit board. Some known electronic systems solder the electronic package directly to the host circuit board. However, such electronic packages are permanently attached to the host circuit board and are not removable. Some known socket assemblies provide a socket substrate between the electronic package and the host circuit board. The electronic packages may be removably coupled to the socket substrate. The data signals, grounded shielding and the electrical power are all connected between the socket substrate and the host circuit board through a bottom interface and then all connected between the socket substrate and the electronic package through a top interface. However, many conductors are dedicated at the interfaces for the data connection, the ground connection and the power connection leading to a large footprint for the socket substrate. The signal performance may be reduced by routing the signal lines in close proximity to the power lines through the socket substrate. Additionally, the routing of the power circuits on the host circuit board occupies board space on the host circuit board. Conventional systems are struggling with meeting signal and power output requirements for the electronic package because there is a need for smaller size and higher number of conductors while maintaining good electrical performance through the system.

A need remains for a high speed socket assembly having improved electrical performance.

BRIEF DESCRIPTION OF THE INVENTION

In one embodiment, a socket assembly is provided for an electronic system including a socket connector including a socket substrate having an upper surface and a lower surface. The socket connector includes upper socket contacts on the upper surface configured to be terminated to an electronic package. The socket connector includes lower socket contacts configured to be terminated to a host circuit board. The upper socket contacts are electrically connected to corresponding lower socket contacts through the socket substrate to electrically connect the electronic package to the host circuit board. The socket connector includes a first power contact and a second power contact electrically connected to the first power contact. The first power contact is configured to be terminated to the electronic package. The socket assembly includes a power connector terminated to the socket substrate having a power connector housing and a power connector terminal held by the power connector housing. The power connector terminal is electrically connected to the second power contact. The socket substrate is configured to electrically connect the power connector to the electronic package through the first power contact and the second power contact.

In another embodiment, a socket assembly is provided for an electronic system including a socket connector including a socket substrate having an upper surface and a lower surface. The socket connector includes upper socket contacts on the upper surface configured to be terminated to an electronic package and lower socket contacts configured to be terminated to a host circuit board. The upper socket contacts are electrically connected to corresponding lower socket contacts through the socket substrate to electrically connect the electronic package to the host circuit board. The socket connector includes a first power contact and a second power contact electrically connected to the first power contact. The first power contact is configured to be terminated to the electronic package. The socket assembly includes a socket frame coupled to the upper surface of the socket substrate having at least one frame wall forming a frame opening above the upper surface configured to locate the electronic package on the upper surface of the socket substrate. The socket assembly includes a power connector terminated to the socket substrate exterior of the frame opening. The power connector has a power connector housing and a power connector terminal held by the power connector housing. The power connector terminal is electrically connected to the second power contact. The socket substrate is configured to electrically connect the power connector to the electronic package through the first power contact and the second power contact.

In a further embodiment, a socket assembly is provided for an electronic system including a socket connector including a socket substrate having an upper surface and a lower surface having a lower mating area configured to be mated to a host circuit board. The socket substrate has a first upper mating area for mating with an electronic package and a second upper mating area for mating with a power connector. The socket assembly includes upper socket contacts at the first upper mating area for mating with the electronic package and lower socket contacts at the lower mating area for mating with the host circuit board being electrically connected to corresponding upper socket contacts. The socket assembly includes first power contacts at the first upper mating area for mating with the electronic package and second power contacts at the second upper mating area for mating with the power connector. The second power contacts are electrically connected to corresponding first power contacts. The upper socket contacts and the first power contacts in the first upper mating area define a package interface for mating with the electronic package. The lower socket contacts define a host circuit board interface for mating with the host circuit board. The second power contacts define a power connector interface for mating with the power connector. The socket substrate is configured to electrically connect the power connector to the electronic package through the first power contact and the second power contact. The socket substrate is configured to electrically connect the host circuit board to the electronic package through the lower socket contacts and the upper socket contacts.

DETAILED DESCRIPTION OF THE INVENTION

Figure 1:
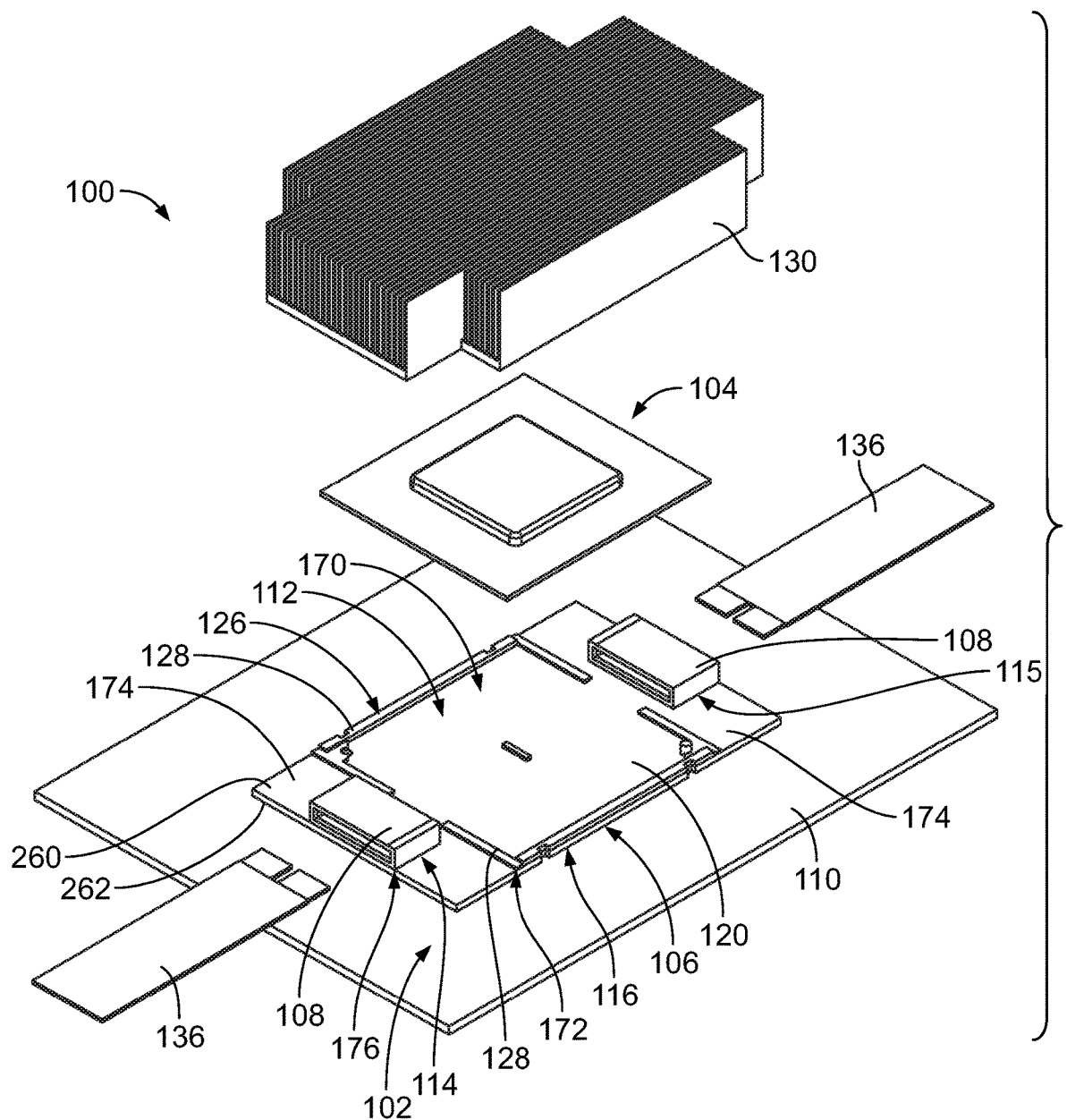
FIG. 1 is an exploded view of an electronic system including a socket assembly formed in accordance with an exemplary embodiment.

FIG. 1 is an exploded view of an electronic system 100 formed in accordance with an exemplary embodiment. The electronic system 100 includes a socket assembly 102 that receives an electronic package 104, such as an integrated circuit. The socket assembly 102 includes a socket connector 106 and one or more power connectors 108. The socket connector 106 is configured to be directly electrically connected to the electronic package 104. In an exemplary embodiment, the socket connector 106 is coupled to a host circuit board 110, such as a motherboard. The socket connector 106 electrically connects the electronic package 104 with the host circuit board 110. The power connector 108 is configured to be directly electrically connected to the socket connector 106. The socket connector 106 electrically connects the power connector 108 to the electronic package 104. In an exemplary embodiment, the socket connector 106 electrically connects the power connector 108 to the electronic package 104 independent of the host circuit board 110. For example, the power from the power connector 108 is transferred to the electronic package 104 through the socket connector 106 without passing through the host circuit board 110. The power circuit for powering the electronic package 104 is contained within the socket connector 106 and is independent of the host circuit board 110. Power for the electronic package 104 is not transferred across the interface between the socket connector 106 and the host circuit board 110, but rather is transferred across the interface between the power connector 108 and the socket connector 106 and across the interface between the electronic package 104 and the socket connector 106.

In the illustrated embodiment, the electronic package 104 is coupled to the top of the socket connector 106 at a first upper mating area 112, multiple power connectors 108 are coupled to the top of the socket connector 106 at second and third upper mating areas 114, 115, respectively, and the bottom of the socket connector 106 is coupled to the host circuit board 110 at a lower mating area 116. Other arrangements are possible in alternative embodiments. For example, greater or fewer power connectors 108 may be coupled to the socket connector 106. Other components may be coupled to the host circuit board 110. The electronic system 100 allows connection of the power connector(s) 108 to the electronic package 104 and connection of the host circuit board 110 directly through the socket connector 106. For example, high speed data signals and/or low speed data signals may be routed through the socket connector 106 between the host circuit board 110 and the electronic package 104 and power may be routed through the socket connector 106 between the power connectors 108 and the electronic package 104.

The power connector 108 may be any type of power component, such as a card edge connector, a straddle mount connector, a socket connector, a plug connector, a press-fit connector, a cable connector, and the like. The power connector 108 may define an interface for interfacing with another mating connector, such as a power cable, a circuit card, a cable connector, a paddle card connector, or another type of mating connector. In other various embodiments, the power connector 108 may be a cable assembly configured to be electrically connected to the socket connector 106. For example, the cable assembly may include one or more power terminals mated to the socket connector 106 at a separable interface or a permanent interface, such as a solder interface, a press-fit interface, and the like. Having the power connector 108 mounted directly to the socket connector 106 reduces the number of circuits or paths at the interface between the socket connector 106 and the host circuit board 110 dedicated to power circuits. Such an arrangement allows a greater number of circuits to be used for data signal paths or ground paths to enhance the data transfer between the socket connector 106 and the host circuit board 110 and/or to reduce the footprint of the socket connector 106 by reducing the number of electrical paths between the socket connector 106 and the host circuit board 110. For example, in various embodiments, all of the power requirements for the electronic package 104 may be handled by the power connector 108 and the socket connector 106 such that there are zero power circuits between the socket connector 106 and the host circuit board 110.

In an exemplary embodiment, electrical paths from the electronic package 104 to the power connector 108 pass through the socket connector 106 and are not routed through the host circuit board 110. For example, in the illustrated embodiment, the electrical paths are power circuits routed through the socket connector 106 between the first and second upper mating areas 112, 114 and between the first and third upper mating area 112, 115. Other electrical paths, such as high speed electrical paths and/or low speed electrical paths, are routed between the first upper mating area 112 and the lower mating area 116 to electrically connect the electronic package 104 and the host circuit board 110. An interface is provided between the socket connector 106 and the host circuit board 110, such as a ball grid array (BGA) having solder balls soldered between the host circuit board 110 and corresponding socket substrate conductors on the bottom of the socket connector 106. However, other types of interfaces may be utilized in alternative embodiments, such as a land grid array (LGA), a compressible contact interface or other types of interfaces. Optionally, the electrical paths between the socket connector 106 and the host circuit board 110 may include high speed electrical paths.

In an exemplary embodiment, the socket connector 106 includes a socket substrate 120 having socket substrate conductors 122 (FIG. 4) that define electrical paths between the electronic package 104 and the power connector 108 and between the electronic package 104 and the host circuit board 110. The socket substrate 120 may be a printed circuit board and the socket substrate conductors 122 may be circuits, pads, traces (of and/or within the socket substrate 120), vias, and the like of the printed circuit board.

The socket connector 106 includes first or upper socket contacts 124 (FIG. 2) coupled to an upper surface 260 of the socket substrate 120 and second or lower socket contacts 125 (FIG. 3) coupled to a lower surface 262 of the socket substrate 120. The socket contacts 124, 125 are electrically connected to corresponding socket substrate conductors 122. For example, in various embodiments, the socket substrate conductors 122 include plated vias through the socket substrate 120 that electrically connect the socket contacts 124, 125. In various embodiments, the socket substrate conductors 122 include pads and or traces on the upper surface 260 and/or the lower surface 262 that electrically connect to the socket contacts 124, 125. The upper socket contacts 124 are located at the first upper mating area 112 and are configured to be electrically connected to the electronic package 104. The upper socket contacts 124 may be compliant contacts, such as spring beam contacts, arranged in an array defining a land grid array (LGA) interface. The lower socket contacts 125 are located at the lower mating area 116 and configured to be electrically connected to the host circuit board 110. The lower socket contacts 125 may be solder balls arranged in an array defining a ball grid array (BGA). However, in alternative embodiments, the lower socket contacts 125 may be compressing contacts, such as spring beam contacts. Other types of contacts may be used for the upper socket contacts 124 and/or the lower socket contacts 125, such as conductive elastomeric contacts.

The socket connector 106 includes first power contacts 134 (FIG. 4) coupled to the upper surface 260 of the socket substrate 120 at the first upper mating area 112 and second power contacts 135 (FIG. 4) coupled to the upper surface 260 of the socket substrate 120 at the second and third upper mating areas 114, 115. The power contacts 134, 135 are electrically connected to corresponding socket substrate conductors 122. For example, in various embodiments, the socket substrate conductors 122 include pads and/or traces and/or plated vias through the socket substrate 120 that electrically connect the power contacts 134, 135. The first power contacts 134 are located at the first upper mating area 112 and are configured to be electrically connected to the electronic package 104. The first power contacts 134 may be compliant contacts, such as spring beam contacts, arranged in an array defining a land grid array (LGA) interface. The first power contacts 134 may be interspersed among the upper socket contacts 124 or grouped together in one or more distinct areas of the first upper mating area 112 from the areas having the upper socket contacts 124. The second power contacts 135 are located at the second and third mating areas 114, 115 and configured to be electrically connected to the power connectors 108. The second power contacts 135 may be pads and/or traces and/or plated vias on the socket substrate 120 in various embodiments. In other embodiments, the second power contacts 135 may be compliant contacts, such as spring beam contacts. In other various embodiments, the second power contacts 135 may be solder balls or solder pads. In various embodiments, the power connector 108 is electrically connected to the top of the socket substrate 120. Additionally or alternatively, the power connector 108 is electrically coupled to the bottom of the socket substrate 120. In an exemplary embodiment, the power connector 108 is configured to be coupled to a power supply component 136, such as a power cable used to supply power to the power connector 108. For example, the power supply component 136 may be plugged into the power connector 108.

The socket assembly 102 includes a socket frame 126 that supports the electronic package 104. In an exemplary embodiment, the socket frame 126 is used to align the electronic package 104 with the first upper mating area 112 for mating the electronic package 104 with the socket connector 106. For example, frame walls 128 of the socket frame 126 may surround a frame opening 170 that receives the electronic package 104. The frame walls 128 orient and align the electronic package 104 in one or more directions. In an exemplary embodiment, the socket frame 126 may limit or stop compression of the compressible interface to prevent damage to various components, such as the upper socket contacts 124. In an exemplary embodiment, the socket frame 126 is mounted to the top of the socket substrate 120 and positions the electronic package 104 on the top of the socket substrate 120. The electronic package 104 may be pre-assembled to the socket frame 126 and the socket substrate 120 prior to mounting the socket connector 106 to the host circuit board 110.

The socket frame 126 has a frame footprint 172 on the socket substrate 120. The frame footprint 172 is defined by the outer edges of the frame walls 128. The frame opening 170 is contained within the frame footprint 172. In an exemplary embodiment, the electronic package 104 is contained within the frame footprint 172. In the illustrated embodiment, the frame footprint 172 is rectangular; however, the frame footprint 172 may have other shapes in alternative embodiments. In an exemplary embodiment, the socket substrate 120 extends beyond the frame footprint 172, such as along one or more extensions 174. In an exemplary embodiment, the power connector 108 has a power connector footprint 176 on the socket substrate 120 not overlapping the frame footprint 172. For example, the power connectors 108 may be coupled to the extensions 174 on opposite sides of the socket frame 126. The power connector footprints 176 may be adjacent the frame footprint 172 or may be spaced apart from the frame footprint 172.

In an exemplary embodiment, the electronic system 100 includes a heat sink 130 for dissipating heat from one or more of the components of the electronic system 100, such as from the electronic package 104 and/or the power connector(s) 108 and/or the socket connector 106 and/or the host circuit board 110. Optionally, the components may include one or more compressible interfaces therebetween. For example, the socket contacts 124 may define a separable, compressible interface with the electronic package 104. The socket contacts 124 may be spring biased against the electronic package 104 when the heat sink 130 is coupled to the socket connector 106.

Figure 2:
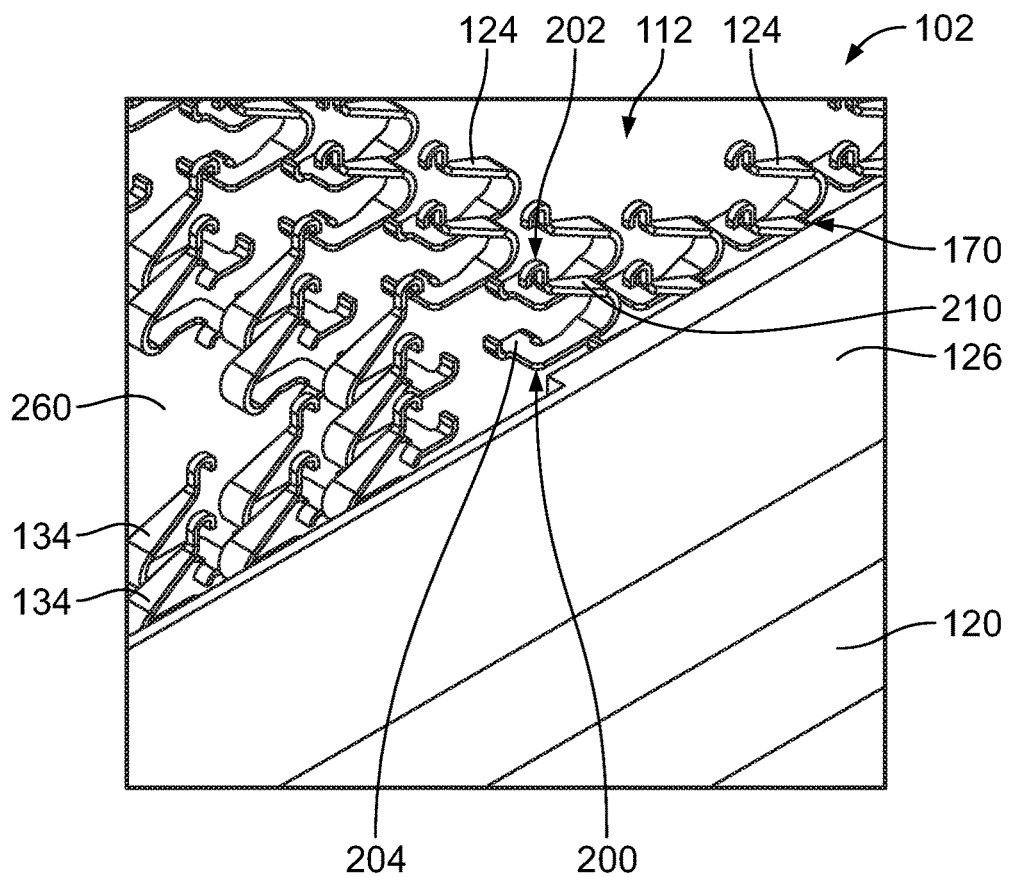
FIG. 2 is an enlarged view of a portion of the socket assembly in accordance with an exemplary embodiment.

FIG. 2 is an enlarged view of a portion of the socket assembly 102 showing the first upper mating area 112. The upper socket contacts 124 are illustrated coupled the upper surface 260 of the socket substrate 120. The upper socket contacts 124 are located in the frame opening 170 inside the socket frame 126 for mating with the electronic package 104 (FIG. 1) when received in the frame opening 170.

The socket contact 124 extends between a terminating end 200 and a mating end 202. The socket contact 124 has a base 204 configured to be mounted to the socket substrate 120 (shown in FIG. 1). The mating end 202 extends from the base 204 and is configured to be mated with the electronic package 104 (shown in FIG. 1). The terminating end 200 extends from the base 204 and is configured to be terminated to the socket substrate 120. In an exemplary embodiment, the terminating end 200 includes a compliant beam, such as an eye-of-the-needle contact, configured to be press-fit into a plated via of the socket substrate 120. The terminating end 200 may be soldered to the socket substrate 120 to mechanically and/or electrically connect the terminating end 200 to the socket substrate 120.

The mating end 202 includes a spring beam 210 extending from the base 204. The spring beam 210 is deflectable. In an exemplary embodiment, the spring beam 210 includes a mating interface for mating with the electronic package 104. In an exemplary embodiment, the mating interface is a separable mating interface. The spring beam 210 may be resiliently deflected during loading to spring bias the mating interface against the electronic package 104 to ensure electrical connection between the socket contact 124 and the electronic package 104. The mating end 202 may have other shapes and features in alternative embodiments. For example, the mating end 202 may include a solder tail or solder tab at the mating end 202 configured to be soldered to the electronic package 104.

Figure 3:
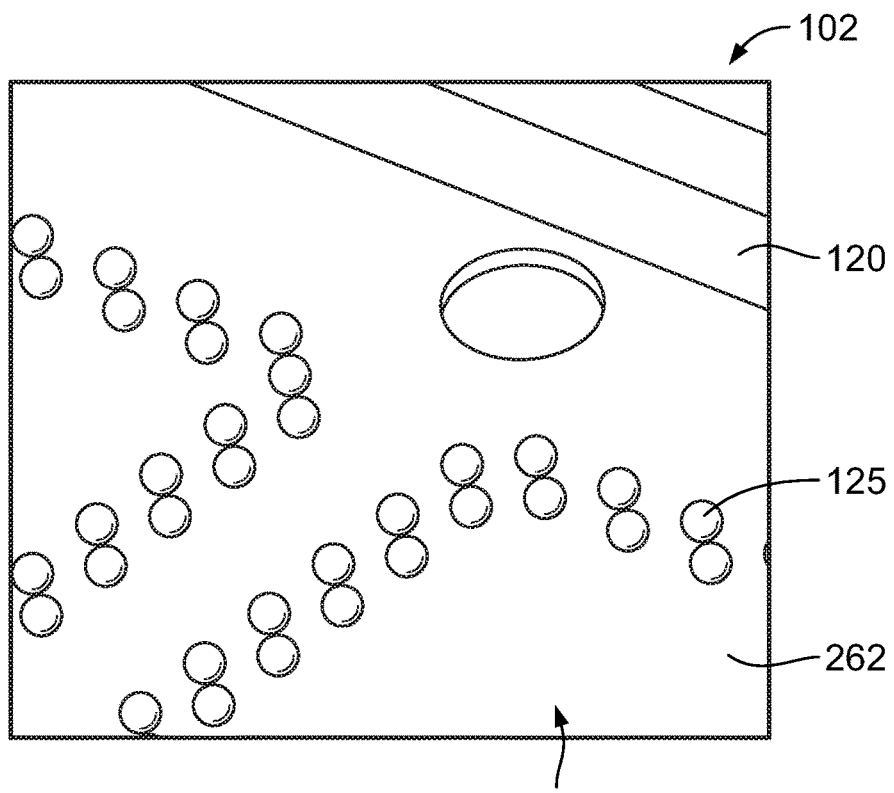
FIG. 3 is an enlarged view of a portion of the socket assembly in accordance with an exemplary embodiment.

FIG. 3 is an enlarged view of a portion of the socket assembly 102 showing the lower mating area 116. The lower socket contacts 125 are illustrated coupled the lower surface 262 of the socket substrate 120. In the illustrated embodiment, the lower socket contacts 125 are solder balls. However, the lower socket contacts 125 may be other types of contacts in alternative embodiments, such as compliant beam contacts, such as similar to the upper socket contacts 124 shown in FIG. 2.

Figure 4:
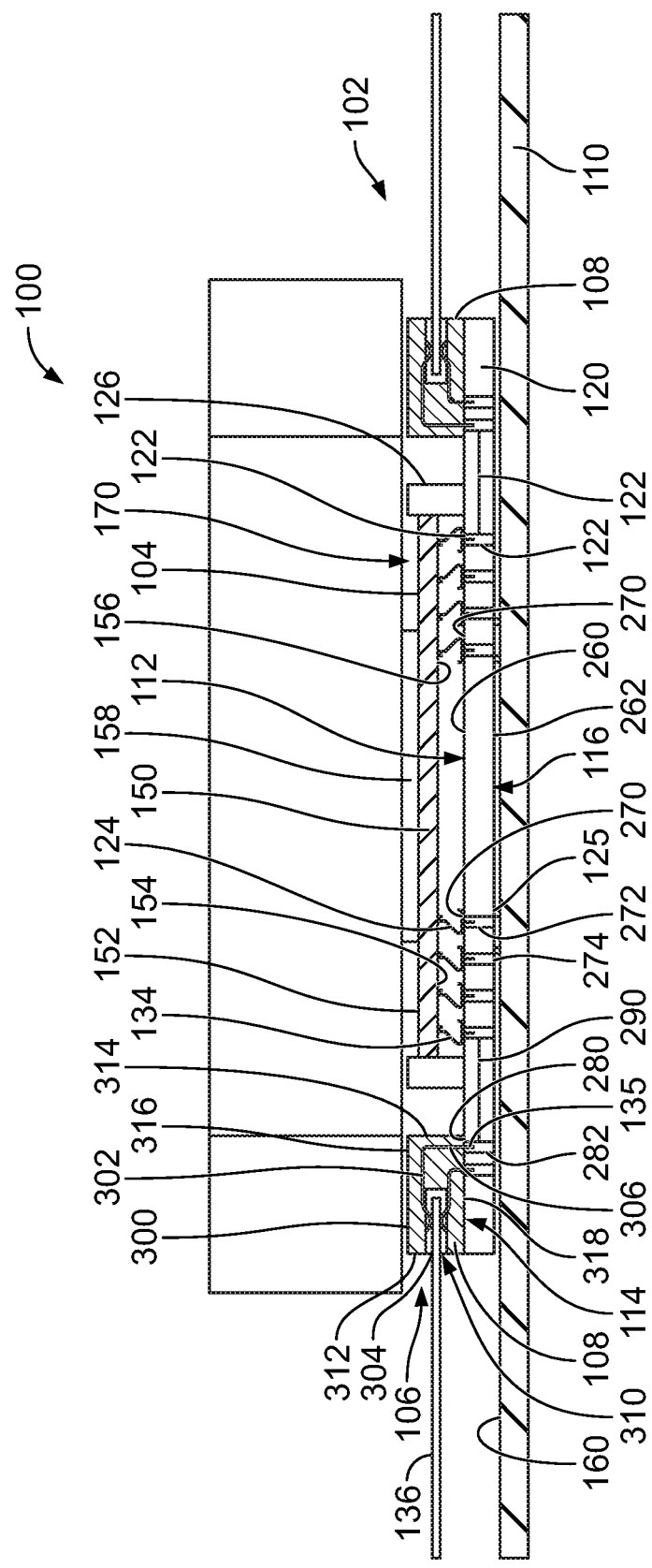
FIG. 4 is a side view of a portion of the electronic system in accordance with an exemplary embodiment.

FIG. 4 is a side view of a portion of the electronic system 100 in accordance with an exemplary embodiment. FIG. 4 illustrates the socket assembly 102 mounted to the host circuit board 110 and the electronic package 104 coupled to the socket assembly 102. For example, the electronic package 104 is received in the socket frame 126 and mated to the upper socket contacts 124 on the socket substrate 120. The electronic package 104 is electrically connected to the host circuit board 110 by the upper socket contacts 124, the corresponding socket substrate conductors 122, and the lower socket contacts 125. The power connector 108 is coupled to the socket substrate 120 and electrically connected to the electronic package 104 by the power contacts 134, 135 and the corresponding socket substrate conductors 122.

In an exemplary embodiment, the electronic package 104 is an integrated circuit component, such as an application-specific integrated circuit (ASIC); however, other types of electronic packages may be used in alternative embodiments, such as photonic integrated circuits, chips, processors, memory devices and the like. The electronic package 104 includes a substrate 150 having an upper surface 152 and a lower surface 154. The electronic package 104 includes package contacts 156 defined by circuits of the substrate 150. In an exemplary embodiment, the package contacts 156 are provided on the lower surface 154; however the electronic package 104 may additionally or alternatively include the package contacts 156 on the upper surface 152. The package contacts 156 may include pads, traces, vias, beams, wires or other types of contacts. In the illustrated embodiment, the electronic package 104 includes an electronic component 158, such as a chip, on the upper surface 152. The electronic component 158 may be electrically connected to the package contacts 156 through traces or circuits of the substrate 150. In an alternative embodiment, rather than having a separate substrate 150 and electronic component 158, the electronic package 104 may be defined by the electronic component 158 without the substrate 150 having the package contacts 156 on the electronic component 158.

During assembly, the socket assembly 102 is positioned above the host circuit board 110 and mechanically and electrically connected to an upper surface 160 of the host circuit board 110. For example, the BGA of solder balls defining the second socket contacts 125 are used to electrically connect the socket assembly 102 to the host circuit board 110. During assembly, the power connector 108 is positioned above the socket substrate 120 and mechanically and electrically connected to the socket substrate 120 at the second upper mating area 114. For example, the second upper mating area 114 may be located outside of the socket frame 126, such as outside of the frame opening 170. The second upper mating area 114 may be remote from the first upper mating area 112. In various embodiments, the power connector 108 may be connected to the power contacts 135 of the socket connector 106 (for example, using press fit contacts of the power connector 108 connected to the plated vias of the socket substrate 120 defining the second power contacts 135). During assembly, the electronic package 104 is positioned above the socket connector 106 and mechanically and electrically connected to the socket connector 106. For example, the electronic package 104 may be aligned with the frame opening 170 in the socket frame 126 and coupled to the upper socket contacts 124 and the first power contacts 134. The socket frame 126 may align and position the electronic package 104 relative to the socket connector 106. The electronic package 104 is forced downward onto the upper socket contacts 124 and the first power contacts 134 to compress the socket contacts 124. For example, the heat sink (shown in FIG. 1) may press downward on the electronic package 104. In other various embodiments, the socket frame 126 may be used to press downward on the electronic package 104, such as with a clip or cover. In an exemplary embodiment, the socket frame 126 may limit compression or downward movement of the electronic package 104, such as to prevent damage or overstress of the upper socket contacts 124 and the first power contacts 134.

The socket substrate 120 may be a printed circuit board and the socket substrate conductors 122 may be circuits of the printed circuit board. For example, the socket substrate conductors 122 may include pads, traces, vias, and the like extending through and/or along one or more layers of and/or within the socket substrate 120, according to various embodiments. The circuits may be signal circuits, ground circuits, power circuits and the like. The socket substrate 120 includes the upper surface 260 and the lower surface 262. In an exemplary embodiment, portions of various socket substrate conductors 122 may be exposed on the upper surface 260 and portions of various socket substrate conductors 122 may be exposed on the lower surface 262.

In an exemplary embodiment, the socket substrate conductors 122 include upper contact pads 270 on the upper surface 260 at the first upper mating area 112 within the frame opening 170 for electrical connection with corresponding upper socket contacts 124. The upper surface 260 may have a solder mask or other layers at the upper surface 260. The upper contact pads 270 are exposed at the upper surface 260 for electrical connection with the upper socket contacts 124. In an exemplary embodiment, the socket substrate conductors 122 include plated vias 272 extending at least partially through the socket substrate 120. In an exemplary embodiment, the socket substrate conductors 122 include lower contact pads 274 on the lower surface 262 at the lower mating area 116 for electrical connection with corresponding lower socket contacts 125. The plated vias 272 are electrically connected to corresponding upper contact pads 270 and lower contact pads 274.

In an exemplary embodiment, the socket substrate conductors 122 include upper contact pads 280 on the upper surface 260 at the second upper mating area 114 for electrical connection with the power connector 108. The second upper mating area 114 is outside of the frame opening 170 and remote from the first upper mating area 112. In an exemplary embodiment, the socket substrate conductors 122 include plated vias 282 extending at least partially through the socket substrate 120 between the upper surface 260 and the lower surface 262 at the second upper mating area 114 and the second lower mating area 118. The plated vias 282 are electrically connected to the power connector 108. Optionally, the socket substrate conductors 122 may include lower contact pads (not shown) on the lower surface 262. The upper contact pads 280 and/or the plated vias 282 define the second power contacts 135. In other various embodiments, the second power contacts 135 may be defined by contacts separate and discrete from the circuits of the socket substrate 120 coupled to (for example, press-fit or soldered to) the upper contact pads 280 and/or the plated vias 282.

In an exemplary embodiment, the socket substrate conductors 122 include traces 290 on one or more layers of and/or within the socket substrate 120 according to various embodiments. The traces 290 define power conductors and may be referred to hereinafter as power conductors 290. The power conductors 290 may be provided within the socket substrate 120 at a certain depth or varying depths, according to various specific embodiments. The power conductors 290 extend between the first upper mating area 112 and the second upper mating area 114 to electrically connect the first and second power contacts 134, 135. For example, the power conductors 290 are electrically connected to corresponding upper contact pads 270 and upper contact pads 280. The power conductors 290 electrically connect the electronic package 104 and the power connector 108. In an exemplary embodiment, the power conductors 290 are not routed to the lower surface 154 and are not electrically connected to the host circuit board 110.

In an exemplary embodiment, first electrical paths are defined between the electronic package 104 and the host circuit board 110 by the upper socket contacts 124, the upper contact pads 270, the plated vias 272, the lower contact pads 274 and the lower socket contacts 125. In an exemplary embodiment, the first electrical paths are used for low speed and/or high speed data signal paths. In an exemplary embodiment, second electrical paths are defined between the electronic package 104 and the power connector 108 by the first power contacts 134, the upper contact pads 270, the traces 290, and the second power contacts 135. The second electrical paths 294 may be used for high speed data signals. In an exemplary embodiment, third electrical paths 296 are defined between the power connector 108 and the host circuit board 110 by the solder balls 163, the upper contact pads 280, the plated vias 282, the lower contact pads 284 and the solder balls 164. The third electrical paths 296 may be used for power and low speed data signal paths.

The power connector 108 includes a power connector housing 300 and power connector terminals 302 held by the power connector housing 300. In an exemplary embodiment, the power connector 108 is a card edge connector; however, other types of electrical connectors may be used in alternative embodiments. In the illustrated embodiment, the power connector 108 is a right angle connector having the mating end perpendicular to the mounting end; however, other orientations are possible in alternative embodiments. In an exemplary embodiment, the power connector 108 is a low profile connector having a low profile height above the socket substrate 120, such as configured to sit below the heat sink. The power connector housing 300 may have a height approximately equal to the height of the socket frame 126. Optionally, the top of the power connector housing 300 may be no taller than the height of the socket frame 126.

The power connector terminals 302 include mating ends 304 and terminating ends 306. The mating ends 304 are configured to be mated with the power supply component 136 (FIG. 1). The terminating ends 306 are electrically connected to the second power contacts 135. For example, in the illustrated embodiment, the terminating ends 306 are compliant pins, such as press fit pins, received in the plated vias 282. However, other types of terminating ends 306 may be provided in alternative embodiments, such as solder tails, solder pads, spring beams, and the like.

The power connector housing 300 includes a slot 310 configured to receive the power supply component 136. The power connector terminals 302 are exposed in the slot 310 to engage and electrically connect to the power supply component 136. The power connector housing 300 includes a front 312 and a rear 314. The slot 310 is open at the front 312 to receive the power supply component 136. Optionally, the power connector terminals 302 may extend from the rear 314 for connecting to the socket substrate 120. The power connector housing 300 includes a top 316 and a bottom 318. In the illustrated embodiment, the bottom 318 is coupled to the upper surface 260 of the socket substrate. In an exemplary embodiment, the power connector terminals 302 may extend from the bottom 318 for electrical connection to the socket substrate 120, such as to the power contacts 135.

Figure 5:
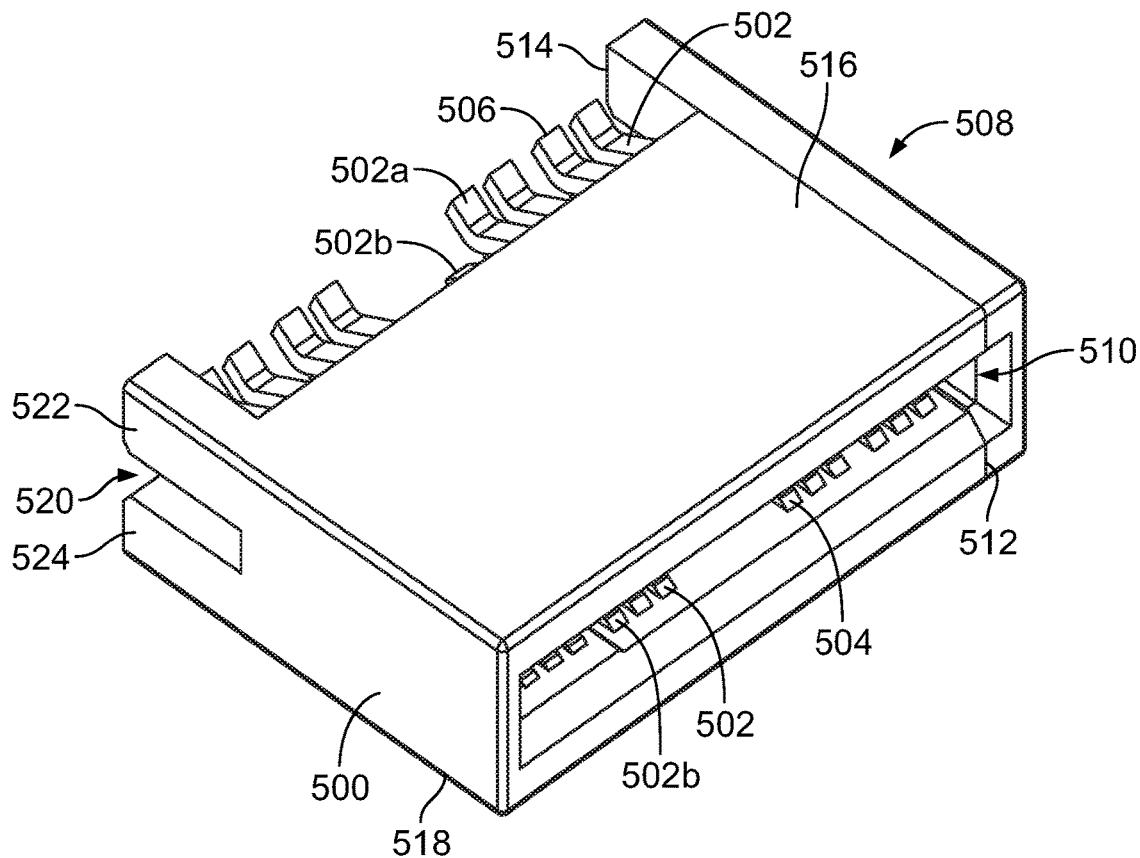
FIG. 5 is a perspective view of a power connector of the socket assembly in accordance with an exemplary embodiment.

FIG. 5 is a perspective view of a power connector 508 in accordance with an exemplary embodiment. The power connector 508 is similar to the power connector 108 and may be used in place of the power connector 108 on the socket substrate 120 (FIG. 4). The power connector 508 includes a power connector housing 500 and power connector terminals 502 held by the power connector housing 500. In an exemplary embodiment, the power connector 508 is a straddle mount connector configured to be coupled to an edge of the socket substrate 120. In an exemplary embodiment, the straddle mount connector is low profile because a portion of the power connector housing 500 is configured to be located above the socket substrate 120 and a portion of the connector housing 500 is configured to be located below the socket substrate 120.

The power connector terminals 502 include mating ends 504 and terminating ends 506. The mating ends 504 are configured to be mated with the power supply component 136 (FIG. 1). The terminating ends 506 are electrically connected to the second power contacts 135. For example, in the illustrated embodiment, the terminating ends 506 are deflectable spring beams configured to be surface mounted to the socket substrate 120. In an exemplary embodiment, the power connector terminals 502 include upper power connector terminals 502a and lower power connector terminals 502b arranged on opposite top and bottom sides of the power connector housing 500 for mating to both top and bottom sides of the power supply component 136 and both upper and lower surfaces of the socket substrate 120.

The power connector housing 500 includes a slot 510 configured to receive the power supply component 136. The power connector terminals 502 are exposed in the slot 510 to engage and electrically connect to the power supply component 136. The power connector housing 500 includes a front 512 and a rear 514. The slot 510 is open at the front 512 to receive the power supply component 136. Optionally, the power connector terminals 502 may extend from the rear 514 for connecting to the socket substrate 120. In an exemplary embodiment, the power connector housing 500 includes a straddle mount slot 520 at the rear 514 that receives an edge of the socket substrate 120. The terminating ends 506 are located above and below the straddle mount slot 520 for engaging the upper and lower surfaces of the socket substrate 120. The power connector housing 500 includes a top 516 and a bottom 518. In the illustrated embodiment, the power connector housing 500 includes upper mounts 522 at the top 516 above the straddle mount slot 520 configured to be coupled to the upper surface 260 of the socket substrate 120. In the illustrated embodiment, the power connector housing 500 includes lower mounts 524 at the bottom 518 below the straddle mount slot 520 configured to be coupled to the lower surface 262 of the socket substrate 120.

Figure 6:
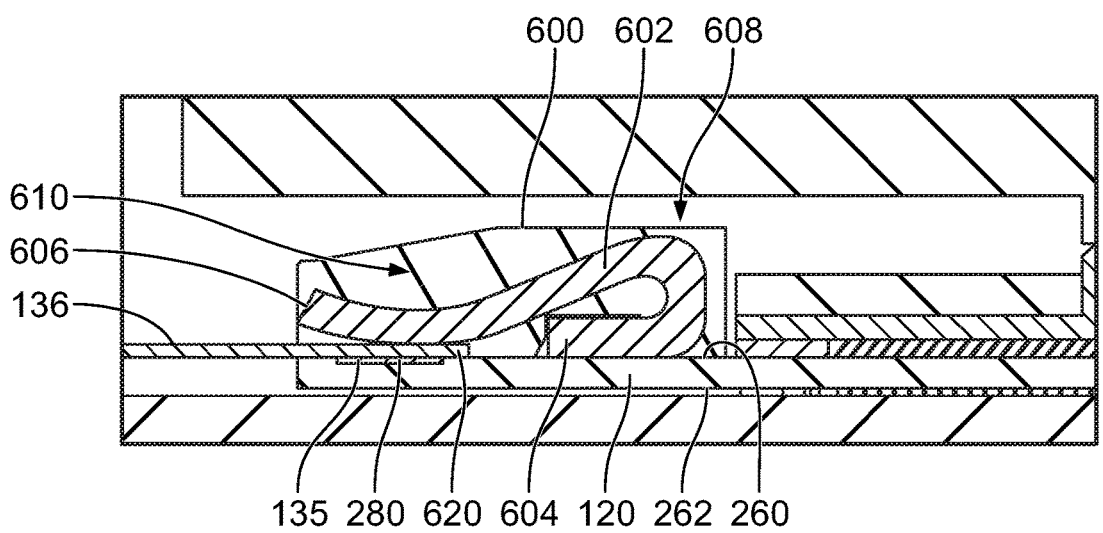
FIG. 6 is a side view of a power connector of the socket assembly in accordance with an exemplary embodiment.

FIG. 6 is a perspective view of a power connector 608 in accordance with an exemplary embodiment. The power connector 608 is similar to the power connector 108 and may be used in place of the power connector 108 on the socket substrate 120 (FIG. 4). The power connector 608 includes a power connector housing 600 and a power connector terminal 602 held by the power connector housing 600. The power connector housing 600 includes a slot 610 configured to receive the power supply component 136. In an exemplary embodiment, the power connector 608 is a clamp connector configured to be coupled to the upper surface 260 of the socket substrate 120. In an exemplary embodiment, the clamp connector is low profile.

The power connector terminal 602 includes a fixed end 604 and a clamp end 606. The fixed end 604 is configured to be fixed in the power connector housing 600. The clamp end 606 is movable relative to the fixed end 604. For example, the clamp end 606 may be deflected when mated with the power supply component 136 (FIG. 1). The clamp end 604 is configured to provide a clamping force to hold the power supply component 136 against the socket substrate 120. For example, the power supply component 136 includes a mating end 620. The mating end 620 is configured to directly engage and electrically connect to the second power contact 135 on the upper surface 260 of the socket substrate 120. For example, the second power contact 135 is defined by the upper contact pads 280. The clamp end 606 presses the mating end 620 into electrical engagement with the upper contact pads 280.

Figure 7:
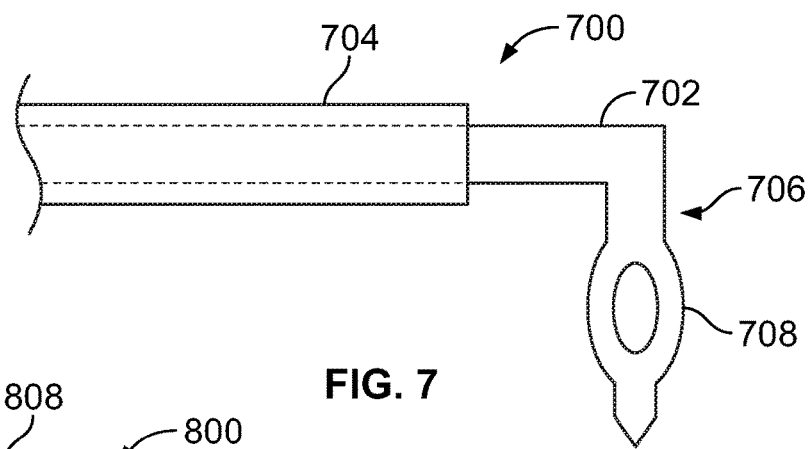
FIG. 7 is a side view of a power connector of the socket assembly in accordance with an exemplary embodiment.

FIG. 7 is a side view of a power connector 700 in accordance with an exemplary embodiment. The power connector 700 is similar to the power connector 108 and may be used in place of the power connector 108 on the socket substrate 120 (FIG. 4). In an exemplary embodiment, the power connector 700 is a cable assembly 700 configured to be coupled directly to the socket substrate 120. The power connector 700 includes a power connector terminal 702 at an end of the cable assembly 700. The power connector terminal 702 may be a flat cable, similar to the power supply component 136 shown in FIG. 1. The cable assembly 700 includes a jacket 704 housing the power connector terminal 702.

The power connector terminal 702 includes a terminating end 706. In the illustrated embodiment, the terminating end 706 includes a compliant pin 708, such as an eye-of-the-needle pin, configured to be press-fit into the socket substrate 120. The compliant pin 708 is stamped and formed with the power connector terminal 702. Optionally, the power connector terminal 702 may include a plurality of compliant pins 708 at the end of the cable assembly 700 configured to be terminated to the socket substrate 120.

Figure 8:
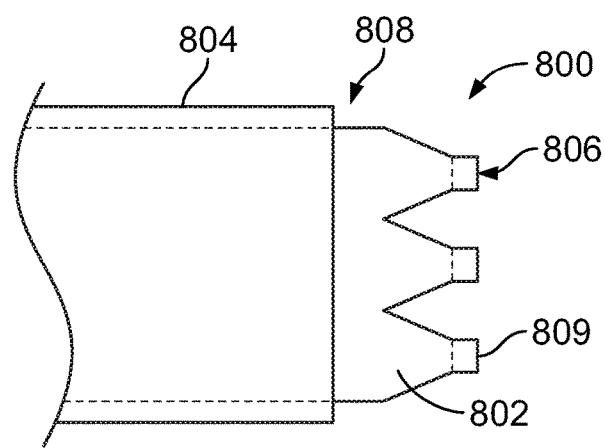
FIG. 8 is a top view of a power connector of the socket assembly in accordance with an exemplary embodiment.

FIG. 8 is a top view of a power connector 808 in accordance with an exemplary embodiment. The power connector 808 is similar to the power connector 608 and may be used in place of the power connector 608 or the power connector 108 on the socket substrate 120 (FIG. 4). In an exemplary embodiment, the power connector 808 is a cable assembly 800 configured to be coupled directly to the socket substrate 120. The power connector 808 includes a power connector terminal 802 at an end of the cable assembly 800. The power connector terminal 802 may be a flat cable, similar to the power supply component 136 shown in FIG. 1. The cable assembly 800 includes a jacket 804 housing the power connector terminal 802.

The power connector terminal 802 includes a terminating end 806. In the illustrated embodiment, the terminating end 806 includes tails 809 bent at right angles from the power connector terminal 802. The tails 809 may be stamped and formed with the power connector terminal 802. The tails 809 are configured to be coupled to the corresponding power contacts of the socket substrate 120.

Figure 9:
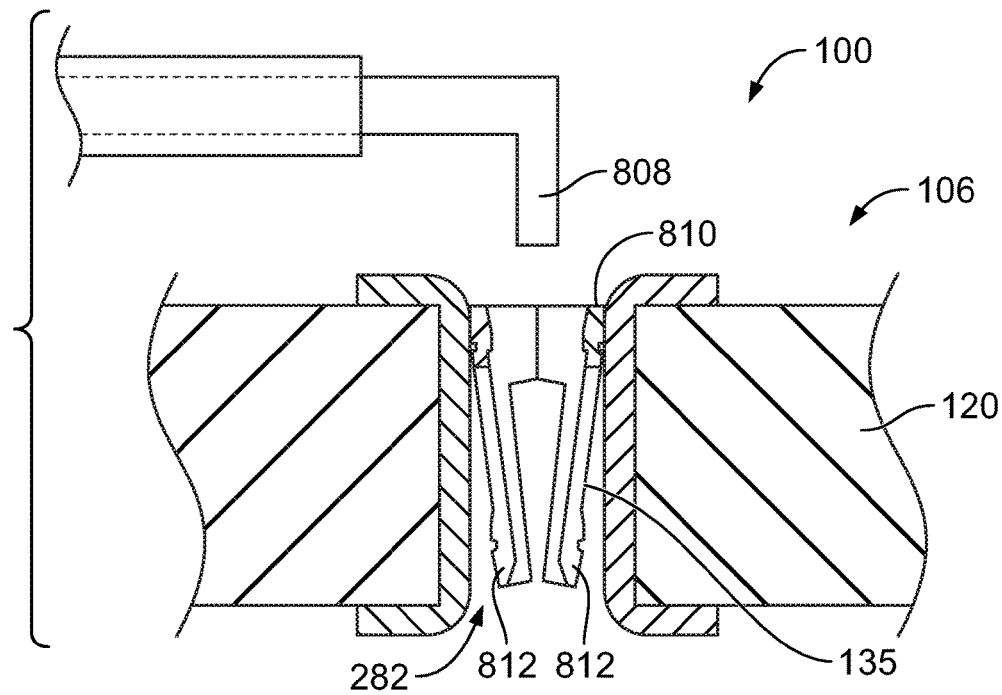
FIG. 9 is a side view of a portion of the electronic system showing a power connector in accordance with an exemplary embodiment.

FIG. 9 is a side view of a portion of the electronic system 100 showing the power connector 808 poised for coupling to the socket connector 106. In the illustrated embodiment, the socket substrate 120 holds socket terminals 810 in the socket substrate 120. The socket terminals 810 define the second power contacts 135. The socket terminals 810 are separate and discrete from the conductors of the socket substrate 120. The socket terminals 810 are received in the plated vias 282 in the socket substrate 120. The socket terminals 810 are electrically connected to the plated vias 282. The tails 808 are configured to be press-fit into the socket terminals 810. The socket terminals 810 include deflectable spring fingers 812 that are configured to engage and electrically connect to the tails 808 when plugged into the socket terminals 810.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A socket assembly for an electronic system comprising:
a socket connector including a printed circuit board defining a socket substrate having an upper surface and a lower surface, the socket connector including upper socket contacts on the upper surface configured to be terminated to an electronic package, the socket connector including lower socket contacts configured to be terminated to a host circuit board, the upper socket contacts being electrically connected to the corresponding lower socket contacts through the socket substrate to electrically connect the electronic package to the host circuit board, the socket connector including a first power contact, the socket connector including a second power contact electrically connected to the first power contact, the first power contact configured to be terminated to the electronic package; and a power connector separate and discrete from the socket substrate and terminated to the socket substrate, the power connector having a power connector terminal being electrically connected to the second power contact;

wherein the printed circuit board defining the socket substrate is configured to electrically connect the power connector to the electronic package through the first power contact and the second power contact.

2. The socket assembly of claim 1, wherein the first and second power contacts are on the upper surface.

3. The socket assembly of claim 1, wherein the power connector powers the electronic package through the first power contact and the second power contact without passing the power through the host circuit board.

4. The socket assembly of claim 1, wherein the socket connector includes a power conductor contained within the socket substrate being electrically connected between the first power contact and the second power contact.

5. The socket assembly of claim 1, wherein the socket substrate includes a first mating area and a second mating area spaced apart from the first mating area, the socket substrate receiving the electronic package at the first mating area, the socket substrate receiving the power connector at the second mating area.

6. The socket assembly of claim 1, further comprising a socket frame coupled to the upper surface of the socket substrate, the socket frame having a frame wall defining a frame opening receiving the electronic package.

7. The socket assembly of claim 6, wherein the power connector is spaced apart from the socket frame.

8. The socket assembly of claim 6, wherein the socket frame has a frame footprint on the socket substrate, the socket substrate extending beyond the frame footprint, the power connector has a power connector footprint on the socket substrate not overlapping the frame footprint.

9. The socket assembly of claim 1, wherein the power connector includes a power connector housing having a slot configured to receive a power supply component, the power connector terminal being exposed in the slot to engage and electrically connect to the power supply component.

10. The socket assembly of claim 1, wherein the power connector includes a straddle mount housing including an upper mount coupled to the upper surface and a lower mount coupled to the lower surface, the power connector terminal being an upper power connector terminal coupled to the upper surface, the straddle mount housing holding a lower power connector terminal coupled to the lower surface.

11. The socket assembly of claim 1, wherein the power connector terminal includes a terminating end being press-fit into the socket substrate to electrically connect to the second power contact.

12. The socket assembly of claim 1, wherein the second power contact comprises a contact pad printed on the socket substrate.

13. The socket assembly of claim 1, wherein the second power contact comprises a plated via in the socket substrate.

14. The socket assembly of claim 1, wherein the first power contact comprises a compressible spring finger having a compressible mating interface for interfacing with the electronic package.

15. The socket assembly of claim 1, wherein the lower socket contacts and the upper socket contacts transmit data signals between the host circuit board and the electronic package.

16. A socket assembly for an electronic system comprising:
a socket connector including a printed circuit board defining a socket substrate having an upper surface and a lower surface, the socket connector including upper socket contacts on the upper surface configured to be terminated to an electronic package, the socket connector including lower socket contacts configured to be terminated to a host circuit board, the upper socket contacts being electrically connected to the corresponding lower socket contacts through the socket substrate to electrically connect the electronic package to the host circuit board, the socket connector including a first power contact, the socket connector including a second power contact electrically connected to the first power contact, the first power contact configured to be terminated to the electronic package;
a socket frame coupled to the upper surface of the socket substrate, the socket frame having at least one frame wall forming a frame opening above the upper surface configured to locate the electronic package on the upper surface of the socket substrate; and
a power connector separate and discrete from the socket substrate and terminated to the socket substrate exterior of the frame opening, the power connector having a power connector terminal being electrically connected to the second power contact;
wherein the printed circuit board defining the socket substrate is configured to electrically connect the power connector to the electronic package through the first power contact and the second power contact.

17. The socket assembly of claim 16, wherein the power connector powers the electronic package through the first power contact and the second power contact without passing the power through the host circuit board.

18. The socket assembly of claim 16, wherein the socket substrate includes a first mating area and a second mating area spaced apart from the first mating area, the socket substrate receiving the electronic package at the first mating area, the socket substrate receiving the power connector at the second mating area.

19. The socket assembly of claim 16, wherein the socket frame has a frame footprint on the socket substrate, the socket substrate extending beyond the frame footprint, the power connector has a power connector footprint on the socket substrate not overlapping the frame footprint.

20. A socket assembly for an electronic system comprising:
a socket connector including a printed circuit board defining a socket substrate having an upper surface and a lower surface, the lower surface having a lower mating area configured to be mated to a host circuit board, the socket substrate having a first upper mating area for mating with an electronic package, the socket substrate having a second upper mating area for mating with a power connector;
upper socket contacts at the first upper mating area for mating with the electronic package;
lower socket contacts at the lower mating area for mating with the host circuit board, the lower socket contacts being electrically connected to corresponding upper socket contacts;
first power contacts at the first upper mating area for mating with the electronic package; and second power contacts at the second upper mating area for mating with the power connector, the second power contacts being electrically connected to corresponding first power contacts;

wherein the upper socket contacts and the first power contacts in the first upper mating area define a package interface for mating with the electronic package, wherein the lower socket contacts define a host circuit board interface for mating with the host circuit board, and wherein the second power contacts define a power connector interface for mating with the power connector;

wherein the printed circuit board defining the socket substrate is configured to electrically connect the power connector to the electronic package through the first power contact and the second power contact, and wherein the socket substrate is configured to electrically connect the host circuit board to the electronic package through the lower socket contacts and the upper socket contacts.

* * * * *